(12) United States Patent
Yamasaki et al.

(10) Patent No.: US 9,799,545 B2
(45) Date of Patent: Oct. 24, 2017

(54) ELECTROSTATIC CHUCK AND METHOD OF MANUFACTURING ELECTROSTATIC CHUCK

(71) Applicant: TOCALO CO., LTD., Kobe-Shi, Hyogo (JP)

(72) Inventors: Ryo Yamasaki, Hyogo (JP); Mitsuharu Inaba, Hyogo (JP); Kensuke Taguchi, Hyogo (JP)

(73) Assignee: TOCALO CO., LTD., Hyogo (JP)

( * ) Notice: Subject to any disclaimer, the term of this patent is extended or adjusted under 35 U.S.C. 154(b) by 324 days.

(21) Appl. No.: 14/397,297

(22) PCT Filed: Mar. 22, 2013

(86) PCT No.: PCT/JP2013/058208
§ 371 (c)(1),
(2) Date: Oct. 27, 2014

(87) PCT Pub. No.: WO2013/168471
PCT Pub. Date: Nov. 14, 2013

(65) Prior Publication Data
US 2015/0116889 A1     Apr. 30, 2015

(30) Foreign Application Priority Data

May 7, 2012  (JP) ................................. 2012-105583

(51) Int. Cl.
*H01L 21/683*     (2006.01)
*C23C 4/12*       (2016.01)
(Continued)

(52) U.S. Cl.
CPC ............ *H01L 21/6833* (2013.01); *C23C 4/01* (2016.01); *C23C 4/11* (2016.01); *C23C 4/12* (2013.01);
(Continued)

(58) Field of Classification Search
CPC ........... H01L 21/67103; H01L 21/6831; H01L 21/6833; H02N 13/00; C23C 4/01; C23C 4/11; C23C 4/12
(Continued)

(56) References Cited

U.S. PATENT DOCUMENTS 7,446,284 B2    11/2008  Fan et al.
2002/0007911 A1  1/2002  Kuibira et al.
(Continued)

FOREIGN PATENT DOCUMENTS

JP    2000-82695    3/2000
JP    2001-274229   10/2001
(Continued)

OTHER PUBLICATIONS

Search report from International Patent Appl. No. PCT/JP2013/058208, mail date is Jun. 18, 2013.
(Continued)

*Primary Examiner* — Thienvu Tran
*Assistant Examiner* — Kevin J Comber
(74) *Attorney, Agent, or Firm* — Greenblum & Bernstein, P.L.C.

(57) ABSTRACT

An electrostatic chuck and a manufacturing method are disclosed in which drawbacks of using an adhesive are not existent and a freedom degree of design is high. The electrostatic chuck includes a substrate part constituting a main chuck body, a first insulating layer of a spray coating formed to the surface of the substrate part, a heater part of an electric conductor formed by applying a conductive paste to the surface of the first insulating layer, a second insulating layer of a spray coating formed to the surface of the first insulating layer so as to cover the heater part, an electrode part formed by thermal spraying to the surface of the second insulating layer and a dielectric layer of a spray coating
(Continued)

formed to the surface of the second layer so as to cover the electrode part and lowers a volume resistivity without using an adhesive.

4 Claims, 3 Drawing Sheets

(51) Int. Cl.
  H02N 13/00 (2006.01)
  H01L 21/67 (2006.01)
  C23C 4/11 (2016.01)
  C23C 4/01 (2016.01)
(52) U.S. Cl.
  CPC .... H01L 21/67103 (2013.01); H01L 21/6831 (2013.01); H02N 13/00 (2013.01)
(58) Field of Classification Search
  USPC .......................................................... 361/234
  See application file for complete search history.

(56) References Cited

U.S. PATENT DOCUMENTS

| | | | |
|---|---|---|---|
| 2003/0019518 A1* | 1/2003 | Shimizu | H01L 31/022425 136/256 |
| 2005/0028739 A1 | 2/2005 | Natsuhara et al. | |
| 2006/0102613 A1* | 5/2006 | Kuibira | H01L 21/67103 219/444.1 |
| 2006/0291132 A1 | 12/2006 | Kanno et al. | |
| 2007/0138601 A1* | 6/2007 | Fan | H01L 21/67011 257/632 |
| 2010/0103584 A1* | 4/2010 | Nam | H01L 21/67103 361/234 |
| 2011/0092072 A1* | 4/2011 | Singh | C23C 14/541 438/710 |
| 2011/0232747 A1 | 9/2011 | Mikeska et al. | |

FOREIGN PATENT DOCUMENTS

| | | |
|---|---|---|
| JP | 2002-9138 | 1/2002 |
| JP | 2002-57207 | 2/2002 |
| JP | 2005-63991 | 3/2005 |
| JP | 2007-88411 | 4/2007 |
| JP | 2007-173828 | 7/2007 |
| JP | 2010-157559 | 7/2010 |
| TW | 200737400 | 10/2007 |
| TW | 200741033 | 11/2007 |
| TW | 201144250 | 12/2011 |

OTHER PUBLICATIONS

English langauge translationof International Preliminary Report on Patentability and Written Opinion in PCT/JP2013/058208, mail date is Nov. 11, 2014.

Office Action issued in Taiwan Counterpart Patent Appl. No. 102109959, dated Oct. 27, 2016.

Office Action issued in Japan Counterpart Patent Appl. No. 2012-105583, dated Mar. 16, 2016 , along with an English translation thereof.

* cited by examiner

ELECTROSTATIC CHUCK AND METHOD OF MANUFACTURING ELECTROSTATIC CHUCK

TECHNICAL FIELD

This invention relates to an electrostatic chuck incorporated into a semiconductor production equipment used in the production process of semiconductors, and a manufacturing method thereof.

RELATED ART

Recently, treatments such as dry etching and the like in the semiconductor production process are changed to a dry method performed under vacuum or under a reduced pressure. In this process, it is important to increase a wafer positioning accuracy during patterning. To this end, a vacuum chuck or a mechanical chuck is employed when the wafer is transported or fixed. In the case of employing the vacuum chuck, however, there is a drawback that an absorption effect is small due to a small pressure difference. In the case of employing the mechanical chuck, there is a drawback that this device becomes complex and a time is taken in maintenance and inspection thereof. Therefore, in order to eliminate these drawbacks, an electrostatic chuck utilizing a static charge is widely employed in late years.

The electrostatic chuck is constructed by disposing an electrode made of tungsten or the like between insulating members such as ceramics, and a wafer is adsorbed and held through coulomb force generated by applying DC voltage to the electrode. Since heat is input to the wafer from plasma during etching, the wafer is cooled by heat conduction through contacting with the electrostatic chuck or by introduction of a cooling gas toward the wafer rear surface to keep the temperature constant.

However, the difference of plasma density or the difference in the flow distribution of the cooling gas is existent in the plane of the wafer, so that it is difficult to constantly keep an in-plane temperature of the wafer in a high accuracy. Therefore, the in-plane temperature of the wafer is controlled to be constant by embedding a heater in the electrostatic chuck. For example, when a temperature variation is caused concentrically in the wafer, plural heaters are arranged in a divisional manner accordingly and the respective heaters are controlled individually so as not to generate the difference in the in-plane temperature of the wafer. Further, in case of multi-process in which a plurality of processes are performed in one chamber, the wafer is made to an optimum temperature for the each process by controlling the heater embedded in the electrostatic chuck.

For example, Patent Document 1 discloses an electrostatic chuck formed by printing a conductive paste for a resistance heating element onto a green sheet having a thickness variation of a given range, laminating with another green sheet and firing them. Patent Document 2 discloses an electrostatic adsorption device comprising a high-resistivity layer formed on a substrate, a plurality of heaters formed by thermal spraying a conductive material in the high-resistivity layer and a plurality of electrodes formed by thermal spraying a conductive material in the high-resistivity layer.

PRIOR ART DOCUMENTS

Patent Documents

Patent Document 1: JP-A-2001-274229
Patent Document 2: JP-A-2007-88411

SUMMARY OF THE INVENTION

Problems to be Solved by the Invention

In the electrostatic chuck of Patent Document 1, it is necessary to use an adhesive for bonding a sintered member obtained by the firing of the green sheet to a metallic substrate including a cooling channel therein. There are drawbacks that since the adhesive has a low thermal conductivity, for example, a response during temperature descending is extremely low and that since the adhesive is consumed by being exposed to plasma, a portion after the consumption of the adhesive cannot be cooled due to a loss of thermal conductivity.

In the electrostatic adsorption device of Patent Document 2, the heater and the electrode are formed by thermal spraying of the conductive material. Since the heater after the thermal spraying is generally high in the volume resistivity, it is necessary to correspond with a large amount of power by making a wiring configuration thicker, wider and shorter as far as possible. Since the heater must be arranged evenly to a required area, the wiring itself becomes longer, and hence the resistivity must be decreased by making the wiring configuration thicker and wider. However, if the wiring configuration is made thicker, the ceramic high-resistivity layer covering the wiring becomes also thick and hence there is a fear of causing breakage or peeling-off of the ceramic high-resistivity layer due to a difference in thermal expansion coefficient among the substrate, the heater formed by thermal spraying and the ceramic high-resistivity layer. If the wiring configuration is made wider, a distance between the wirings becomes small. Therefore, a space for forming, for example, a pusher pin hole or a cooling gas hole is restricted. That is, when the heater or the electrode is formed by thermal spraying the conductive material as in the electrostatic adsorption device of Patent Document 2, there is a problem that the freedom degree of design becomes extremely low.

The invention is made in consideration of the problems of the conventional techniques and is to provide an electrostatic chuck and a manufacturing method of the electrostatic chuck in which the aforementioned drawbacks in case of using the adhesive are not existent and the freedom degree of design is high.

Means for Solving Problems

The following technical means are used for achieving the above object.

An electrostatic chuck according to the invention comprise a substrate part constituting a main chuck body for holding a wafer, a plurality of insulating layers each made of a spray coating formed to a wafer holding side of the substrate part, a heater part of an electric conductor formed by applying a conductive paste to a surface at the wafer holding side of one or more insulating layers among the above plural insulating layers, an electrode part formed by thermal spraying a spraying material or applying a conductive paste to a surface at the wafer holding side of one or more insulating layers among the plural insulating layers, and a dielectric layer of a spray coating formed to the wafer holding sides of the plural insulating layers.

In the electrostatic chuck according to the invention, each of the plural insulating layers and the dielectric layer is made of the spray coating and the electrode part is formed by thermal spraying the spraying material or applying the conductive paste, so that the plural insulating layers, the dielectric layer and the electrode part can be disposed on the substrate part without utilizing the adhesive. Since the heater part is made of the electric conductor formed by applying the conductive paste to the surface of the insulating layer, it is possible to lower a volume resistivity of the heater part.

An electrostatic chuck according to the invention comprises a substrate part constituting a main chuck body for holding a wafer, an insulating layer of a spray coating formed to a surface at a wafer holding side of the substrate part, a heater part of an electric conductor formed by applying a conductive paste to the surface at the wafer holding side of the insulating layer, an electrode part formed by thermal spraying a spraying material or applying a conductive paste to the surface at the wafer holding side of the insulating layer and a dielectric layer of a spray coating formed to the wafer holding side of the insulating layer.

In the electrostatic chuck according to the invention, each of the insulating layer and the dielectric layer is made of the spray coating and the electrode part is formed by thermal spraying the spraying material or applying the conductive paste, so that the insulating layer, the dielectric layer and the electrode part can be disposed to the substrate part without utilizing the adhesive. Since the heater part of the electric conductor is formed by applying the conductive paste to the surface of the insulating layer, it is possible to lower a volume resistivity of the heater part.

The conductive paste is preferable to have a residual amount after curing of not more than 5% by weight. When the residual amount is small, it is possible to prevent a decrease in the adhesion force between the heater part of the electric conductor and the insulating layer or the dielectric layer.

It is preferable that the heater part is wired in an elongate shape with a line width of not more than 5 mm. When the heater part has a line width of not more than 5 mm, it is possible to prevent a decrease in the adhesion force to the insulating layer or the dielectric layer.

It is preferable that a surface roughness of the surface of the insulating layer forming the heater part is not more than 6 μm as Ra value. In this case, bleeding in the application of the conductive paste can be eliminated, and it is possible to form the heater part in a high accuracy.

The spray coating is preferable to be made from one or more materials selected from oxide-based ceramics, nitride-based ceramics and fluoride-based ceramics. In this case, the insulating layer having an appropriate heat conductivity and a high insulating property, and the dielectric layer having high heat conductivity, dielectric property, plasma resistance and wear resistance can be realized.

A method of manufacturing an electrostatic chuck according to the invention comprises a step of forming an insulating layer by thermal spraying a spraying material to a wafer holding side of a substrate part constituting a main chuck body to form an insulating layer; a step of forming a heater part by applying a conductive paste to a surface at the wafer holding side of the insulating layer through either one of screen printing method, ink-jet method and dispenser method to form a heater part made of an electric conductor; a step of forming an electrode part by thermal spraying a spraying material or applying a conductive paste through either one of screen printing method, ink-jet method and dispenser method to a surface at the wafer holding side of the insulating layer to form an electrode part; and a step of forming a dielectric layer by thermal spraying a spraying material at the wafer holding side of the insulating layer to form a dielectric layer.

According to the method of manufacturing the electrostatic chuck of the invention, the insulating layer and the dielectric layer are formed by thermal spraying the spraying material in the insulating layer forming step and the dielectric layer forming step; the heater part of the electric conductor is formed by applying the conductive paste to the surface of the insulating layer through either one of screen printing method, ink-jet method and dispenser method in the heater portion forming step; and the electrode part is formed by thermal spraying the spraying material or applying the conductive paste through either one of screen printing method, ink-jet method and dispenser method to the surface of the insulating layer in the electrode part forming step, so that the insulating layer, the dielectric layer and the electrode part can be formed without using the adhesive to the substrate part, and the volume resistivity of the heater part can be lowered.

Effect of the Invention

As mentioned above, according to the invention, the insulating layer and the dielectric layer are made of the spray coating and the electrode part is formed by thermal spraying the spraying material or applying the conductive paste, so that the insulating layer, the dielectric layer and the electrode part are disposed to the substrate part without using the adhesive. Also, the heater part is made of an electric conductor formed by applying the conductive paste, so that the volume resistivity of the heater part can be lowered. Therefore, it is possible to eliminate the drawbacks in the use of the adhesive, and the freedom degree of design can be made higher.

EMBODIMENTS FOR CARRYING OUT THE INVENTION

Figure 1:
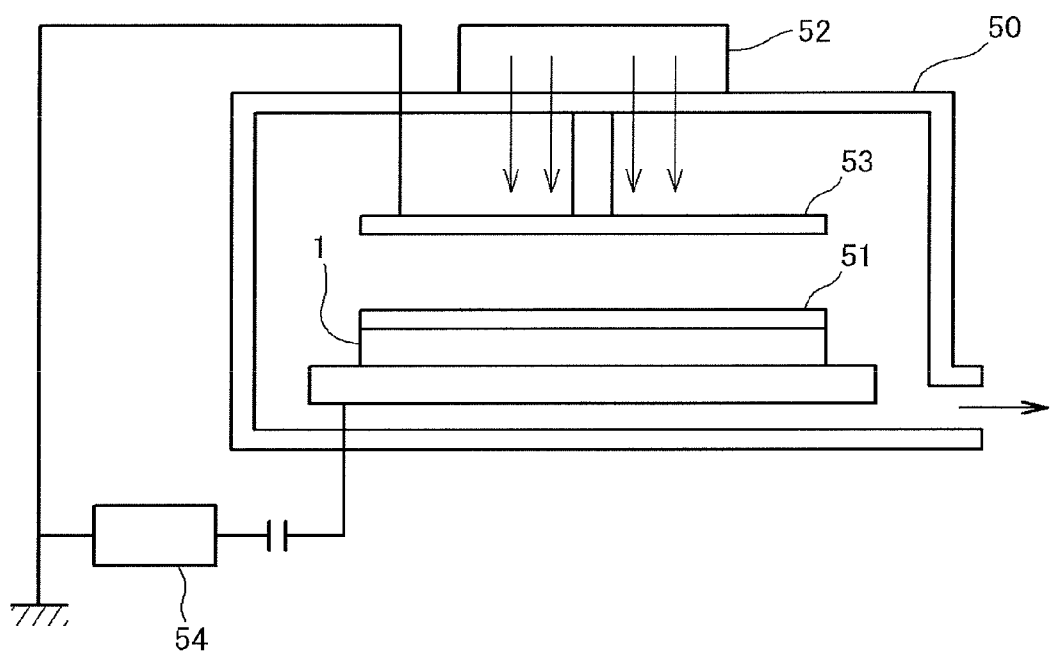
FIG. 1 is a schematic view showing a state that an electrostatic chuck according to one embodiment of the invention is disposed in a vacuum chamber.

Hereinafter, an embodiment of the invention will be explained with reference to the drawings. FIG. 1 is a schematic view showing a state that an electrostatic chuck 1 according to one embodiment of the invention is disposed in a vacuum chamber 50. As shown in FIG. 1, the electrostatic chuck 1 for holding a wafer 51 is disposed in the vacuum chamber 50, and the wafer 51 is taken in and out from the vacuum chamber 50 by means of a transfer arm (not shown) or the like. In the vacuum chamber 50 are arranged a gas introduction device 52, an upper electrode 53 and the like. The electrostatic chuck 1 is also served as a lower electrode, and a high-frequency power source 54 is connected to the lower electrode (electrostatic chuck 1) and the upper electrode 53. When a high-frequency wave is applied between the lower electrode 1 and the upper electrode 53, an introduced process gas is changed into plasma, and etching is performed by introducing a plasma ion generated to the wafer 51, during which a temperature of the wafer 51 is increased.

Figure 2:
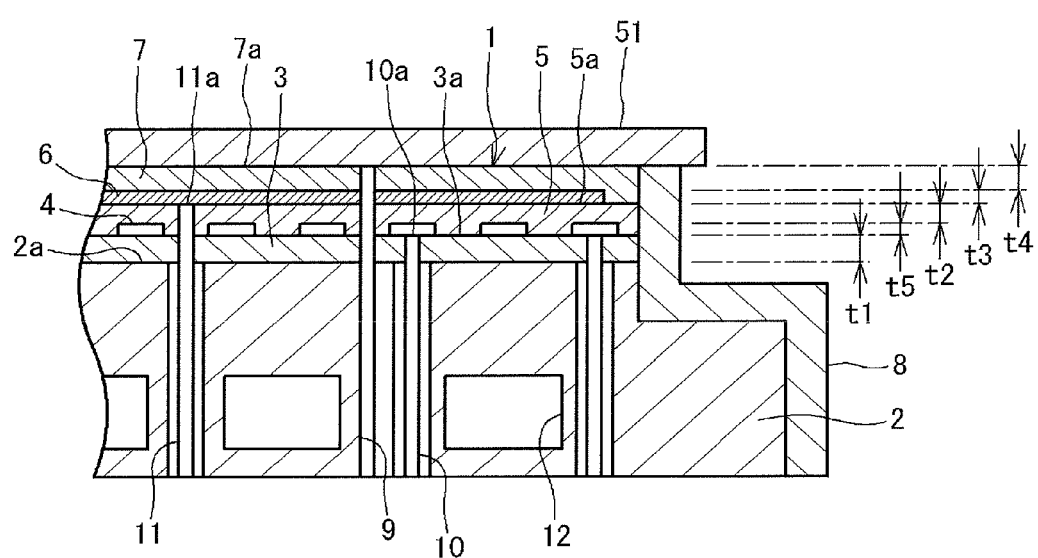
FIG. 2 is a schematically section view of an electrostatic chuck.

FIG. 2 is a schematically section view of the electrostatic chuck 1. The electrostatic chuck 1 of this embodiment comprises a substrate part 2 constituting a main chuck body for holding the wafer 51, a first insulating layer 3 formed to a surface 2a at a wafer holding side of the substrate part 2, a heater part 4 of an electric conductor formed to a surface 3a of the first insulating layer 3, a second insulating layer 5 formed to the surface 3a of the first insulating layer 3 so as to cover the heater part 4, an electrode part 6 formed to a surface 5a of the second insulating layer 5, and a dielectric layer 7 formed as an outermost layer so as to cover the electrode part 6.

The outside of the electrostatic chuck 1 is coated with a coating layer 8 made of $Al_2O_3$ spray coating so as not to exert an influence of plasma to the electrostatic chuck 1 itself.

In the electrostatic chuck 1 is formed a gas hole 9 penetrating in a vertical direction as shown in FIG. 2. The gas hole 9 is connected to a cooling recess (not shown) formed on the surface 7a of the dielectric layer 7. For example, helium gas is introduced through the gas hole 9 into a space between the wafer 51 and the electrostatic chuck 1. Since the inside of the vacuum chamber 50 is kept under a reduced pressure, the heat conductivity from the wafer 51 to the electrostatic chuck 1 is low. By introducing the gas between the wafer 51 and the electrostatic chuck 1 is transmitted heat from the wafer 51 to the electrostatic chuck 1, whereby the cooling effect of the wafer 51 is ensured.

The heater part 4 made of an electric conductor is constructed to generate heat by current conduction. A first feeding pin 10 for supplying power to the heater part 4 is penetrated through the first insulating layer 3 and the substrate part 2 and connected electrically to the heater part 4 to control an output power to the heater part 4. A second feeding pin 11 for supplying power to the electrode part 6 is penetrated through the second insulating layer 5, the first insulating layer 3 and the substrate part 2 and connected electrically to the electrode part 6 to control the application of voltage to the electrode part 6. In the substrate part 2 is formed a cooling channel 12 for flowing a cooling medium, and the substrate part 2 is cooled by the cooling medium passing through the cooling channel 12.

The substrate part 2 of this embodiment is made of an aluminum alloy. However, a material constructing the substrate part 2 is not limited and may include a titanium alloy, a copper alloy, stainless steel, carbon, ceramics such as AlN ceramic and the like, and a composite material such as $Al_2O_3$—Al or the like. The temperature of the cooling medium flowing in the cooling channel 12 of the substrate part 2 is $-20\sim50°$ C. The temperature of the cooling medium is controlled in response to a rate of cooling the wafer 51 and a warming ability of the heater part 4.

The first insulating layer 3 formed in the surface 2a of the substrate part 2 is made of $Al_2O_3$ spray coating formed by thermal spraying, and insulates the substrate part 2 and the heater part 4. The second insulating layer 5 formed in the surface 3a of the first insulating layer 3 so as to cover the heater part 4 is made of $Al_2O_3$ spray coating formed by thermal spraying, and insulates the heater part 4 and the electrode part 6. In this embodiment, a thickness t1 of the first insulating layer 3 and a thickness t2 of the second insulating layer 5 are 50~400 μm. The heat removal efficiency by the first insulating layer 3 and the second insulating layer 5 can be controlled by varying the thickness and material of the first insulating layer 3 and the second insulating layer 5.

When the thickness t1 of the first insulating layer 3 and thickness t2 of the second insulating layer 5 are made thin and a material having a high heat conduction coefficient is used, it is possible to make the heat removal efficiency higher. As the heat removal efficiency becomes higher, the cooling rate of the wafer 51 is increased. On the contrary, when the thickness t1 of the first insulating layer 3 becomes thin, the substrate part 2 easily absorbs heat from the heater part 4, so that it is necessary to increase the output power of the heater part 4. When the thickness t1 of the first insulating layer 3 and thickness t2 of the second insulating layer 5 are made thick and a material having a low heat conduction coefficient is used, it is possible to lower the heat removal efficiency. As a typical material having the low heat conduction coefficient is mentioned PSZ (partially stabilized zirconia). As the heat removal coefficient is made low, the cooling rate of the wafer 1 is decreased. On the contrary, when the thickness t1 of the first insulating layer 3 is made thick or the heat conduction coefficient of the material is made low, the substrate part 2 hardly absorbs heat from the heater part 4, and hence it is not necessary to increase the output power of the heater part 4. For example, if the cooling rate of the wafer 51 is too high, the thickness t1 of the first insulating layer 3 and thickness t2 of the second insulating layer 5 may be made thick and a material having a low heat conduction coefficient may be used, whereby a maximum output power of the heater part 4 can be lowered.

The electrode part 6 formed in the surface 5a of the second insulating layer 5 is made of a tungsten spray coating formed by thermal spraying. By applying a voltage to the electrode part 6 is adsorbed the wafer 51 onto the electrostatic chuck 1. The dielectric layer 7 formed in the surface 5a of the second insulating layer 5 so as to cover the electrode part 6 is made of $Al_2O_3$ spray coating formed by thermal spraying. In this embodiment, the thickness t3 of the electrode part 6 is 30~100 μm and the thickness t4 of the dielectric layer 7 is 50~400 μm.

The $Al_2O_3$ spray coating constituting each of the first insulating layer 3, second insulating layer 5 and dielectric layer 7 is formed by thermal spraying $Al_2O_3$ spraying powder to each of the surfaces 2a, 3a and 5a of the substrate part 2, first insulating layer 3 and second insulating layer 5 through an atmospheric plasma spraying method. The tungsten spray coating constituting the electrode part 6 is formed by thermal spraying tungsten spraying powder to the surface 5a of the second insulating layer 5 through an atmospheric plasma spraying method. The thermal spraying method for obtaining the $Al_2O_3$ spray coating and the tungsten spray coating is not limited to the atmospheric plasma spray method, but may include a low-pressure plasma spraying method, a water plasma spraying method, and a high-velocity or low-velocity flame spraying method.

The spraying powder is used to have a particle size range of 5~80 μm. When the particle size is less than 5 μm, the flowability of the powder is decreased, and the powder cannot be supplied stably and the thickness of the coating becomes non-uniform, while when the particle size exceeds 80 μm, the coating is formed at a state of melting the powder incompletely and made excessively porous to coarsen the quality of the coating.

The sum of thicknesses t1, t2, t3, t4 of the respective spray coatings constituting the first insulating layer 3, second insulating layer 5, electrode part 6 and dielectric layer 7 and thickness t5 of the heater part 4 is preferably a range of 200~1500 μm, more preferably a range of 300~1000 μm. When the sum of the thicknesses is less than 200 μm, the uniformity of the spray coating is deteriorated and the function of the coating cannot be developed sufficiently, while when it exceeds 1500 μm, the influence of residual stress in the spray coating becomes larger, leading to the decreased of mechanical strength.

Each of the above spray coatings is a porous body and is preferable to have an average porosity of 5~10%. The average porosity is varied in accordance with the spraying method or the spraying conditions. When the porosity is less than 5%, the influence of residual stress existing in the each spray coating becomes large, leading to the decrease of mechanical strength. While, when the porosity exceeds 10%, a variety of gases used in the semiconductor production process are easily intruded into the respective spray coating to deteriorate the endurance of the respective spray coating.

In this embodiment, as a material of each of the respective spray coatings constituting the first insulating layer 3, second insulating layer 5 and dielectric layer 7 is employed $Al_2O_3$, but the other oxide based ceramics, nitride based ceramics, fluoride based ceramics, carbide based ceramics, boride based ceramics and a mixture thereof may be employed. Among them, the oxide based ceramics, nitride based ceramics, fluoride based ceramics and a mixture thereof are preferable.

The oxide based ceramics are stable in O-based plasma used in the plasma etching process and exhibit a relatively good plasma resistance even in Cl-based plasma. The nitride based ceramics are high in the hardness, less in the damage due to the rubbing with the wafer and hardly generate abrasion powder or the like. Also, it is relatively high in the heat conductivity, so that the temperature of the wafer during processing is easily controlled. The fluoride based ceramics are stable in F-based plasma and can exhibit an excellent plasma resistance.

As a concrete example of the other oxide based ceramics are mentioned $TiO_2$, $Si_2$, $Cr_2O_3$, $ZrO_2$, $Y_2O_3$, MgO and CaO. As the nitride based ceramics are mentioned TiN, TaN, AlN, BN, $Si_3N_4$, HfN, NbN, YN, ZrN, $Mg_3N_2$ and $Ca_3N_2$. As the fluoride based ceramics are mentioned LiF, $CaF_2$, $BaF_2$, $YF_3$, $AlF_3$, $ZrF_4$ and $MgF_2$.

As the carbide based ceramics are mentioned TiC, WC, TaC, $B_4C$, SiC, HfC, ZrC, VC and $Cr_3C_2$. As the boride based ceramics are mentioned $TiB_2$, $ZrB_2$, $HfB_2$, $VB_2$, $TaB_2$, $NbB_2$, $W_2B_5$, $CrB_2$ and $LaB_6$. As to the first insulating layer 3 and the second insulating layer 5, it is particularly preferable to employ a material establishing the required heat conductivity and insulation property among the above ceramics. As to the dielectric layer 7, it is particularly preferable to employ a material possessing heat conductivity (heat conduction coefficient of the dielectric layer is preferable to be higher), dielectric property, plasma resistance and abrasion resistance among the above ceramics.

Figure 3:
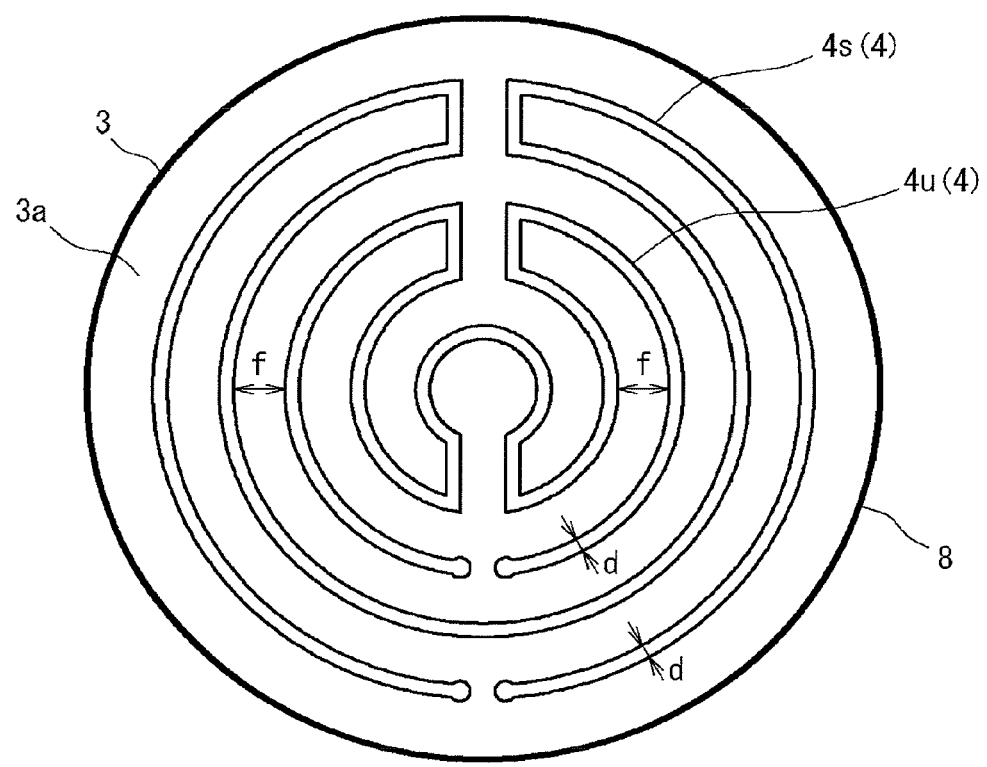
FIG. 3 is a schematically plane view showing a heater part.

FIG. 3 is a schematically plane view showing the heater part 4. The heater part 4 made of an electric conductor is formed by applying a conductive paste to the surface 3a of the first insulating layer 3 through screen printing. The method of applying the conductive paste is not limited to the screen printing, but an ink-jet method and a dispenser method may be employed. When the heater part 4 is formed by applying the conductive paste through either one of the screen printing, the ink-jet method and the dispenser method, it is possible to form the heater part 4 on the surface 3a of the first insulating layer 3 without using the adhesive and by an easy operation.

The conductive paste is generally formed by dispersing a metallic powder such as silver powder or an electric conductor such as carbon powder in a binder such as alkyd resin, epoxy resin or the like. In this embodiment, however, a binder-less type conductive paste substantially containing no binder is employed. This conductive paste is selected so that a residual amount after curing is preferably not more than 5% by weight, more preferably not more than 1% by weight. Moreover, it should be noted that the volume resistivity after curing of the binder-less type conductive paste is, for example, $4 \times 10^{-6}$ ($\Omega$cm) and $1 \times 10^{-5}$ ($\Omega$cm), and a volume resistivity after curing of a binder type conductive paste is, for example, $8 \times 10^{-5}$ ($\Omega$cm) and $2 \times 10^{-5}$ ($\Omega$cm), and a volume resistivity of the tungsten spray coating is, for example, $2 \times 10^{-4}$ ($\Omega$cm).

If the heater part is formed with a binder-containing conductive paste having a large residual amount after curing, the binder is burnt or melted in the thermal spraying on the heater part. As a result, the adhesion force between the heater part and the spray coating thermal sprayed thereon is lowered, or the performances of the heater part are damaged. When the binder-less type conductive paste substantially containing no binder and being very small in the residual amount after curing is used as in this embodiment, the decrease of the adhesion force between the heater part 4 and the second insulating layer 5 thermal sprayed thereon can be prevented, and there is no damage in the performances of the heater part 4.

Almost all of the conductive pastes being less in the residual amount after curing form an electric conductor by fusing metal particles through firing. If the particle size is made small, the specific surface area is increased, so that the fusion is easily caused when the particle size is made smaller. Therefore, when using the conductive paste having a smaller particle size, it is possible to form the heater part 4 at a lower firing temperature. Since the silver paste used in this embodiment is formed by dispersing silver nanopowder in water or an organic solvent with a surfactant or the like, it is decomposed and evaporated at a low temperature and can be fired at a relatively low temperature.

The conductive paste is selected in accordance with the material constituting the substrate part 2 in addition to the residual amount after curing and the volume resistivity. When the substrate part 2 is made of aluminum alloy as in this embodiment, the conductive paste is selected to have a firing temperature required for curing of preferably not higher than 200° C., more preferably not higher than 150° C. If the substrate part 2 is made of titanium alloy, the conductive paste is selected to have a firing temperature of preferably not higher than 300° C. Since the first insulating layer 3 is formed on the surface 2a of the substrate part 2 and the conductive paste is screen-printed onto the surface 3a of the first insulating layer 3, if the firing temperature of the conductive paste is too high, the difference in thermal expansion coefficient between the substrate part 2 and the first insulating layer 3 becomes larger to cause cracking in the first insulating layer 3.

A material of the conductive paste is not limited and uses a metallic powder made from a noble metal such as gold, silver, platinum and palladium, a metal such as tungsten, molybdenum, nickel, chrome, iron, copper, aluminum and titanium, and an alloy thereof. In this embodiment is employed a silver paste as the conductive paste, which is optimally selected in accordance with a processing temperature of the semiconductor production process, a kind of etching gas, a kind of chemical and the like.

The surface roughness of the surface 3a of the first insulating layer 3 formed with the heater part 4 is preferably not more than 6 μm as Ra value, more preferably not more than 3 μm as Ra value. When it exceeds 6 μm as Ra value, bleeding is generated when the conductive paste is applied and hence wiring of the heater part becomes unclear. Since the cross sectional area of the heater part is varied, the resistivity value is largely varied partially to cause abnormal heat generation. Also, there is a possibility that wirings of adjacent heater parts are short-circuited with each other. When the surface roughness of the surface 3a of the first insulating layer 3 is set to not more than 6 μm as Ra value, bleeding can be eliminated when the conductive paste is applied, whereby the heater part 4 can be formed in a high accuracy. In order to obtain a good adhesion force of the second insulating layer 5 formed on the surface 3a of the first insulating layer 3, the surface roughness is preferable to be 1~3 μm as Ra value.

As shown in FIG. 3, the heater part 4 is constructed with a concentric inner heater 4u and an outer heater 4s positioned outside thereof. The construction of the heater part 4 is not limited, but it may be constructed with one heater or with three or more heaters in response to a heating region. If it is constructed with one heater, for example, it may be arranged by only one circle at an outer region. In this embodiment, an inner region and an outer region of the electrostatic chuck 1 can be heated at different temperatures to each other by controlling independently the inner heater 4u and the outer heater 4s.

The heater part 4 is designed to set within a predetermined resistance value by determining thickness, line width, line length and volume resistivity in response to an output power require for controlling the temperature of the wafer 51. However, a variation is actually existent when the heater part 4 is formed, so that there is a case that the resistance value becomes not a designed value. Particularly, the thickness and the line width are important. If the thickness or the line width becomes locally large, the resistance value is lowered at its place, and hence it is difficult to cause heat generation and a low temperature portion is generated in the wafer 51.

In such a case, trimming for modifying the thickness and line width are performed by detecting a portion of lowering the resistance value after the formation of the heater part 4 and then grinding a part of the heater part 4 so as to set the resistance value within a predetermined range. In order to detect the portion having the low resistance value, there are a method wherein the resistance value is measured by four-terminal method, for example, every a certain section, and a method wherein that a heating state through energization of the heater part 4 is determined by a thermo-camera or the like. The trimming is performed by a laser machining or a mechanical grinding.

Since variations of a machining amount and a resistance value are not linear, it is practically difficult to sufficiently decrease the variation of the resistance value of the respective portion only by grinding the portion having a low resistance value. In order to perform the trimming more accurately, it is preferable to monitor a variation of the resistance value or the heating state during the trimming. For example, when the resistance value is measured by four-terminal method every certain section, it is possible to know what portion to be trimmed by what Ω. The trimming process proceeds while monitoring a resistance value of such a portion, and the trimming process is finished when the monitored resistance value reaches to a desired resistance value. As the other method, the temperature variation may be reduced by arranging a heat diffusing plate in the electrostatic chuck.

Before the formation of the heater part 4, the first feeding pin 10 for feeding a power to the heater part 4 is previously penetrated through the substrate part 2 and the first insulating layer 3, and the upper end face 10a of the first feeding pin 10 is exposed to the surface 3a of the first insulating layer 3. Thereafter, the first feeding pin 10 and the heater part 4 are electrically connected to each other by screen-printing the heater part 4 to the surface 3a of the first insulating layer 3. This process is the same as those of the electrode part 6. That is, the second feeding pin 11 for feeding a power to the electrode part 6 is previously penetrated through the substrate part 2, the first insulating layer 3 and the second insulating layer 5, and the upper end face 11a of the second feeding pin 11 is exposed to the surface 5a of the second insulating layer 5. Thereafter, the second feeding pin 11 and the electrode part 6 are electrically connected to each other by thermal spraying the electrode part 6 to the surface 5a of the second insulating layer 5.

Each of the inner heater 4u and the outer heater 4s is wired in an elongated manner at a line width d of 2 mm. The line width d in the inner heater 4u and the outer heater 4s is preferably not more than 5 mm, more preferably not more than 2 mm. Since the adhesion force of the second insulating layer 5 to the heater part 4 is lower than the adhesion force to the first insulating layer 3, if the line width d of the heater part 4 exceeds 5 mm and the exposing area of the surface 3a of the first insulating layer 3 becomes small, the adhesion force of the second insulating layer 5 is decreased.

The distance between lines f in the heaters 4u and 4s is preferably not less than 1 mm, more preferably not less than 2 mm. When the distance between lines f in the heaters 4u and 4s is too small, short-circuit is caused. Also, since the adhesion force of the second insulating layer 5 to the heater part 4 is lower than the adhesion force to the first insulating layer 3, if the distance between lines f in the heaters 4u and 4s is small and the exposing area of the surface 3a of the first insulating layer 3 becomes small, the adhesion force of the second insulating layer 5 is decreased.

A thyristor, an inverter or the like is used for controlling an output power to the heater part 4, and a power of, for example, about 100 kW/m$^2$ is output to the heater part 4 for providing a desired temperature rising state. The heater part 4 may be subjected to feedback control by embedding temperature sensors in desired sites of the electrostatic chuck 1 to detect a temperature of the respective site or by detecting a temperature of the wafer 51 in noncontact manner.

The electrostatic chuck 1 is manufactured by a manufacturing method of an electrostatic chuck comprising the following steps. That is, the manufacturing method of the electrostatic chuck comprises an insulating layer forming step by thermal spraying a spraying material to a surface 2a of a substrate part 2 constituting a main chuck body for holding a wafer 51 to form a first insulating layer 3 and a second insulating layer 5, a heater part forming step by applying a conductive paste to the surface 3a of the first insulating layer 3 through either one of screen printing method, ink-jet method and dispenser method to form a heater part 4 made of an electric conductor, an electrode part forming step by thermal spraying a spraying material to the surface 5a of the second insulating layer 5 to form an electrode part 6, and a dielectric layer forming step by thermal spraying a spraying material to the surface 5a of the second insulating layer 5 so as to cover the electrode part 6 to form a dielectric layer 7.

According to the electrostatic chuck 1 and its manufacturing method of this embodiment, each of the first insulating layer 3, the second insulating layer 5, the electrode part 6 and the dielectric layer 7 is made of the spray coating, so that the first insulating layer 3, the second insulating layer 5, the electrode part 6 and the dielectric layer 7 can be disposed onto the substrate part 2 without using the adhesive. Therefore, it is possible to eliminate problems such as deterioration of a response due to the use of an adhesive, deterioration of heat conductivity due to wastage by plasma for cooling and the like. When the electrostatic chuck is manufactured by using a green sheet, an amount of impurities becomes large due to the existence of glass component or sintering agent. In the electrostatic chuck 1 of this embodiment, however, the amount of impurities can be decreased as much as possible because the glass component and sintering agent are not used. Moreover, in the case of making the electrostatic chuck 1 larger, it may be manufactured in a low cost as compared with a case of manufacturing with a sintered member obtained by firing the green sheet.

When the heater part is formed by thermal spraying, the volume resistivity becomes larger, and hence it is necessary to make the wiring in thicker, wider and shorter state as much as possible in correspondence to a high power. In this embodiment, the heater part 4 is made of the electric conductor formed by applying the conductive paste, so that the volume resistivity of the heater part 4 is low. Since the volume resistivity is low, the freedom degree of the design in the heater part 4 can be made higher. Therefore, even if the wiring of the heater part 4 is made longer, the form can be made thinner and narrower, whereby it is made possible to prevent cracking or peeling of the heater part 4 due to the difference in thermal expansion coefficient between the first insulating layer 3 and the heater part 4. Since it is not necessary to widen the width of the wiring in the heater part 4, the distance between lines f can be made larger to ensure a space for forming, for example, a pusher pin hole or a cooling gas hole. Also, it is possible to secure sufficient adhesion force of the second insulating layer 5 to the first insulating layer 3. Further, the variation of the heating state can be made smaller as compared with a case of forming by thermal spraying, and the temperature of the wafer 51 can be controlled accurately.

The above embodiments are merely exemplified and are not limited thereto. For example, positions of the heater part and the electrode part may be changed. That is, the electrostatic chuck comprises a substrate part constituting a main chuck body for holding a wafer, a first insulating layer formed onto the surface of the substrate part at its wafer holding side by thermal spraying, an electrode part formed onto the surface of the first insulating layer at its wafer holding side by thermal spraying, a second insulating layer of a spray coating formed on the surface of the first insulating layer at its wafer holding side so as to cover the electrode part, a heater part of an electric conductor formed by applying a conductive paste to the surface of the second insulating layer at its wafer holding side, and a dielectric layer of a spray coating formed onto the surface of the second insulating layer at its wafer holding side so as to cover the heater part.

The heater part and the electrode part may be formed in the same layer. That is, the electrostatic chuck comprises a substrate part constituting a main chuck body for holding a wafer, an insulating layer of a spray coating formed onto the surface of the substrate part at its wafer holding side, a heater part of an electric conductor formed by applying a conductive paste to the surface of the insulating layer at its wafer holding side, an electrode part formed by thermal spraying at a wafer holding side of the insulating layer, and a dielectric layer of a spray coating formed onto the surface of the insulating layer at its wafer holding side so as to cover these electrode part and heater part.

The heater part may be used as the electrode part. That is, the electrostatic chuck comprises a substrate part constituting a main chuck body for holding a wafer, an insulating layer of a spray coating formed onto the surface of the substrate part at its wafer holding side, a heater part (electrode part) of an electric conductor formed by applying a conductive paste to the surface of the insulating layer at its wafer holding side, and a dielectric layer of a spray coating formed onto the surface of the insulating layer at its wafer holding side so as to cover the heater part.

Even in the electrostatic chucks having the above constructions, the insulating layer, the heater part, the electrode part and the dielectric layer are formed by the same method as in the above embodiment, so that there is no drawback occurring in the case of using the adhesive, and the freedom degree of design can be made higher accordingly. The above embodiment has a three layer structure of the insulating layers and the dielectric layer, but a two layer structure of the insulating layer and the dielectric layer may be taken as in the aforementioned structure, or the heater part or the electrode part may be formed in each of two or more layers among a four or more layer structure. The shape of the electrode part, the feeding pin, the gas hole and the cooling channel may be properly changed in accordance with the semiconductor production process. The surface of the dielectric layer contacting with the wafer may be embossed to control the adsorption property. An object supported by the electrostatic chuck may be any form, and includes a glass substrate for a flat panel display and the like in addition to the wafer.

The electrode part may be formed with a conductive paste likewise the heater part. In this case, the electrode part is formed by applying the conductive paste through screen printing method, ink-jet method or dispenser method. Also, electrostatic adsorption system by the electrostatic chuck is not limited to the method utilizing Coulomb's force in the above embodiments, but may utilize, for example, Gradient force or Johnsen-Rahbek force.

EXAMPLES

Hereinafter, the invention will be explained in detail with reference to an example. Moreover, the invention is not limited to the following examples. As Examples 1~4 are manufactured electrostatic chucks shown in FIG. 2, while as Comparative Examples 1~8 are manufactured, heater parts formed by applying a conductive paste or by thermal spraying a spraying material in the electrostatic chuck shown in FIG. 2, and then determination of right and wrong working, test of heat-resistant temperature, and test of applying 5000 W are performed. In Examples 1~4 and Comparative Examples 1~8, all of the surfaces are subjected to #400 abrasive finishing, and the heater has a specification of one channel and 5000 W, and the substrate is a φ300 aluminum alloy, and trimming is not performed. The manufacturing conditions of respective examples and comparative examples are shown in Table 1.

In case of manufacturing the heater part having a specification of 5000 W, a calculation example of a thickness will be explained. A voltage of commercial power source is 200 V and thus a current value is 5000÷200=25 A. In order to flow a current of 25 A by applying 200 V, a resistance value R between terminals of the heater part is 200÷25=8Ω. When the heater part is arranged concentrically on the substrate of φ300 at a line width of 3 mm and a pitch of 6 mm (distance between lines: 3 mm), an entire length L becomes about 11310 mm, a thickness (cross sectional area÷line width) is determined in accordance with a volume resistivity ρ so as to render a resistance value R into 8Ω by the following equation.

Cross sectional area=volume resistivity ρ×entire length L÷resistance value R

In the test of heat-resistant temperature, the chuck is left to stand in a thermostatic device (substrate is not cooled) and the temperature is raised from room temperature at 2° C./min to measure a temperature of causing a crack in an outer appearance. The test by applying 5000 W is performed by applying a power of 5000 W to the heater part and keeping for 10 minutes while cooling a rear surface of the substrate at 20° C. A symbol X in Table 1 shows disconnection due to burning of the heater part on the way of the test, or a large change of the resistance value in the entire heater part before and after the test, or a variation of the resistance value exceeding 10% before and after the thermal spraying of the second insulating layer.

TABLE 1

|  | Method of forming heater part | Surface roughness of first insulating layer | Thickness of heater part (t5) | Total thickness | Line width of heater part (d) | Distance between lines in heater part (f) |
|---|---|---|---|---|---|---|
| Example 1 | Application of conductive paste (residual amount 1%) | Ra = 3 μm | 43 μm | 943 μm | 2 mm | 2 mm |
| Example 2 | Application of conductive paste (residual amount 1%) | Ra = 5 μm | 19 μm | 919 μm | 3 mm | 3 mm |
| Example 3 | Application of conductive paste (residual amount 1%) | Ra = 3 μm | 15 μm | 915 μm | 4 mm | 2 mm |
| Example 4 | Application of conductive paste (residual amount 4%) | Ra = 3 μm | 47 μm | 947 μm | 3 mm | 3 mm |
| Comparative Example 1 | Application of conductive paste (residual amount 1%) | Ra = 3 μm | 7 μm | 907 μm | 6 mm | 3 mm |
| Comparative Example 2 | Application of conductive paste (residual amount 1%) | Ra = 7 μm | 19 μm | 919 μm | 3 mm | 3 mm |
| Comparative Example 3 | Application of conductive paste (residual amount 6%) | Ra = 3 μm | 95 μm | 995 μm | 3 mm | 3 mm |
| Comparative Example 4 | Application of conductive paste (residual amount 6%) | Ra = 3 μm | 220 μm | 1120 μm | 2 mm | 2 mm |
| Comparative Example 5 | Application of conductive paste (residual amount 15%) | Ra = 3 μm | 380 μm | 1280 μm | 3 mm | 3 mm |
| Comparative Example 6 | Thermal spraying | Ra = 3 μm | 950 μm | 1850 μm | 3 mm | 3 mm |
| Comparative Example 7 | Thermal spraying | Ra = 7 μm | 950 μm | 1850 μm | 3 mm | 3 mm |
| Comparative Example 8 | Thermal spraying | Ra = 3 μm | 320 μm | 1220 μm | 6 mm | 3 mm |

The measured results are shown in Table 2. In all of the examples, the working is possible, and the heat-resistant temperature is 180° C. and the result in the test by applying 5000 W is good. In the comparative examples, however, the working is often impossible, and the heat-resistant temperature is low even if the working is possible, and the increase of the resistance value is observed even in the test by applying 5000 W.

TABLE 2

|  | Judgment of working | Heat-resistive temperature | 5000 W application | Estimation |
|---|---|---|---|---|
| Example 1 | Working possible | 180° C. | ○ | ○ |
| Example 2 | Working possible | 180° C. | ○ | ○ |
| Example 3 | Working possible | 180° C. | ○ | ○ |
| Example 4 | Working possible | 180° C. | ○ | ○ |
| Comparative Example 1 | Spray coating on conductive paste is partially peeled off during formation of the second insulating layer | — | — | x |

TABLE 2-continued

| | Judgment of working | Heat-resistive temperature | 5000 W application | Estimation |
|---|---|---|---|---|
| Comparative Example 2 | Working possible: however, there is bleeding of paste | 180° C. | x: resistance value increases by 20% | x |
| Comparative Example 3 | Spray coating on conductive paste is partially peeled off during formation of the second insulating layer | — | — | x |
| Comparative Example 4 | Working possible | 140° C. | x: resistance value increases by 30% | x |
| Comparative Example 5 | Spray coating on conductive paste is partially peeled off during formation of the second insulating layer | — | — | x |
| Comparative Example 6 | Crack occurs to spray coating including insulating layer during formation of dielectric layer | — | — | x |
| Comparative Example 7 | Crack occurs to spray coating including insulating layer during formation of dielectric layer | — | — | |
| Comparative Example 8 | Working possible | 120° C. | ○ | Δ |

DESCRIPTION OF REFERENCE SYMBOLS

1 electrostatic chuck
2 substrate part
2a surface
3 first insulating layer
3a surface
4 heater part
5 second insulating layer
5a surface
6 electrode part
7 dielectric layer
9 gas hole
10 first feeding pin
11 second feeding pin
12 cooling channel
50 vacuum chamber
51 wafer

The invention claimed is:

1. An electrostatic chuck comprising:
a substrate that provides a main chuck body for holding a wafer, the substrate being made of at least one of: an aluminum alloy, a titanium alloy, a copper alloy, a stainless steel, AlN ceramic, and a composite material of $Al_2O_3$—Al;
a plurality of insulating layers each made of a spray coating formed to a wafer holding side of the substrate;
a heater of an electric conductor formed by applying a conductive paste to a first formation surface at a wafer holding side of one or more insulating layers among the plural insulating layers, wherein the heater has an elongated wiring with a line width of not more than 5 mm and wherein a covering surface of the insulating layer formed on the heater has a surface roughness of not more than 6 μm as Ra value;
an electrode formed by thermal spraying a spraying material or applying a conductive paste to a second formation surface at the wafer holding side of one or more insulating layers among the plural insulating layers;
a dielectric layer made of a spray coating formed to the wafer holding side of one or more insulating layers among the plural insulating layers; and
a contact surface of the one or more insulating layers, which is opposite to a side of the one or more insulating layers on which the heater is provided, is directly formed on an upper surface of the substrate, and
wherein the conductive paste has a residual amount after curing of not more than 5% by weight.

2. An electrostatic chuck according to claim 1, wherein the spray coating is made from one or more materials selected from oxide-based ceramics, nitride-based ceramics and fluoride-based ceramics.

3. An electrostatic chuck comprising:
a substrate that provides a main chuck body for holding a wafer, the substrate being made of at least one of: an aluminum alloy, a titanium alloy, a copper alloy, a stainless steel, AlN ceramic, and a composite material of $Al_2O_3$—Al;
an insulating layer of a spray coating formed to a surface at a wafer holding side of the substrate;
a heater of an electric conductor formed by applying a conductive paste to a wafer holding side of the insulating layer, wherein the heater has an elongated wiring with a line width of not more than 5 mm and wherein a covering surface of the insulating layer formed on the heater has a surface roughness of not more than 6 μm as Ra value;
an electrode formed by thermal spraying a spraying material or applying a conductive paste to a surface at the wafer holding side of the insulating layer; and
a dielectric layer of a spray coating formed to the wafer holding side of the insulating layer,
a contact surface of the insulating layer, which is opposite to a side of the insulating layer on which the electrode and heater is provided, is directly formed on an upper surface of the substrate, and wherein the conductive paste has a residual amount after curing of not more than 5% by weight.

4. A method of manufacturing an electrostatic chuck comprising:

forming a plurality of insulating layers each made by thermal spraying a spraying material to a wafer holding side of a substrate that provides a main chuck body, forming the substrate of at least one of: an aluminum alloy, a titanium alloy, a copper alloy, a stainless steel, AlN ceramic, and a composite material of $Al_2O_3$—Al;

forming a heater of an electric conductor by applying a conductive paste to a first formation surface at the wafer holding side of one or more insulating layers among the plural insulating layers through either one of screen printing method, ink-jet method and dispenser method, wherein the heater has an elongated wiring with a line width of not more than 5 mm and wherein a covering surface of the insulating layer formed on the heater has a surface roughness of not more than 6 μm as Ra value;

forming an electrode by thermal spraying a spraying material or applying a conductive paste through either one of screen printing method, ink-jet method and dispenser method to a second formation surface at the wafer holding side of the one or more insulating layers among the plural insulating layers;

forming a dielectric layer by thermal spraying a spraying material at the wafer holding side of the one or more insulating layers among the plural insulating layers;

directly forming a contact surface of the one or more insulating layers, which is opposite to a side of the one or more insulating layers on which the heater is provided, on an upper surface of the substrate; and providing the conductive paste to have a residual amount after curing of not more than 5% by weight.

* * * * *